United States Patent
Chun

(10) Patent No.: US 7,079,425 B2
(45) Date of Patent: Jul. 18, 2006

(54) DATA OUTPUT CIRCUIT IN A SEMICONDUCTOR MEMORY DEVICE AND CONTROL METHOD OF A DATA OUTPUT CIRCUIT

(75) Inventor: Ki-Chul Chun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 109 days.

(21) Appl. No.: 10/942,829

(22) Filed: Sep. 17, 2004

(65) Prior Publication Data

US 2005/0057983 A1   Mar. 17, 2005

(30) Foreign Application Priority Data

Sep. 17, 2003  (KR) .................. 10-2003-0064344

(51) Int. Cl.
*G11C 7/10* (2006.01)

(52) U.S. Cl. ............................ 365/189.01; 365/225.7
(58) Field of Classification Search .......... 365/189.01, 365/225.7, 230.06; 327/108, 109, 112
See application file for complete search history.

(56) References Cited

U.S. PATENT DOCUMENTS

| | | | |
|---|---|---|---|
| 5,923,595 A | 7/1999 | Kim | 365/189.05 |
| 5,999,483 A | 12/1999 | Itou | 365/233 |
| 6,559,690 B1 * | 5/2003 | Waldrop | 327/108 |
| 6,885,226 B1 * | 4/2005 | Waldrop | 327/112 |

* cited by examiner

*Primary Examiner*—Vu A. Le
(74) *Attorney, Agent, or Firm*—Volentine Francos & Whitt, PLLC

(57) ABSTRACT

A semiconductor memory device with a data output circuit that flexibly sets an initial value of a driver strength using fuses.

21 Claims, 9 Drawing Sheets

FIG.1 (PRIOR ART)
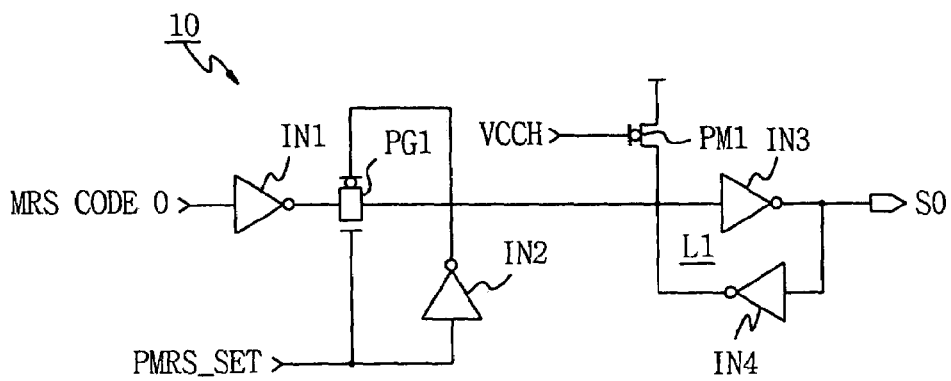
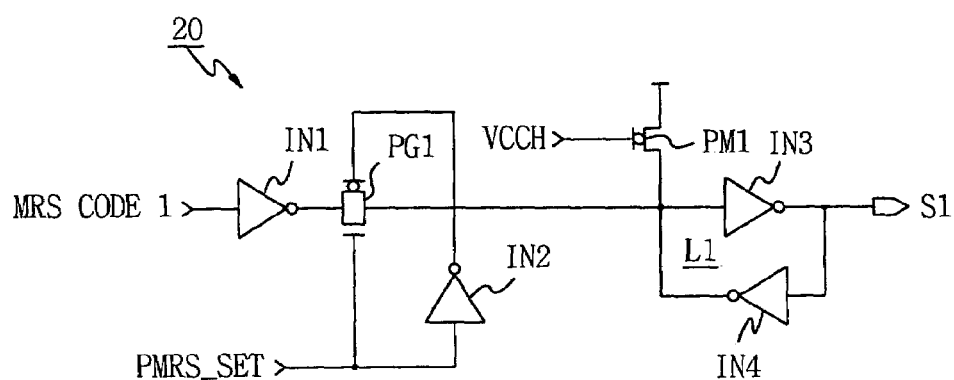
FIG.2 (PRIOR ART)
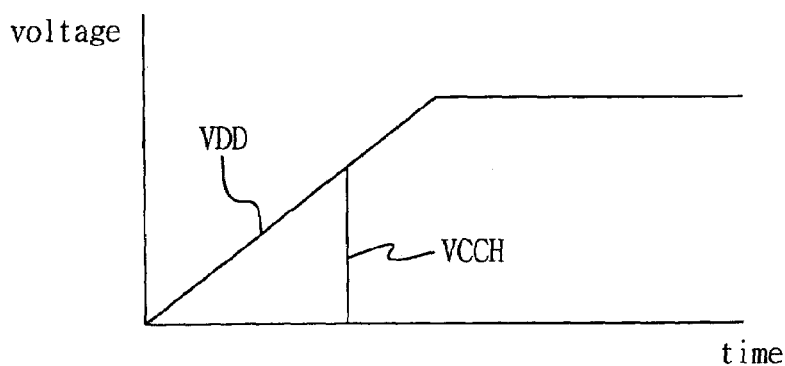

FIG.7
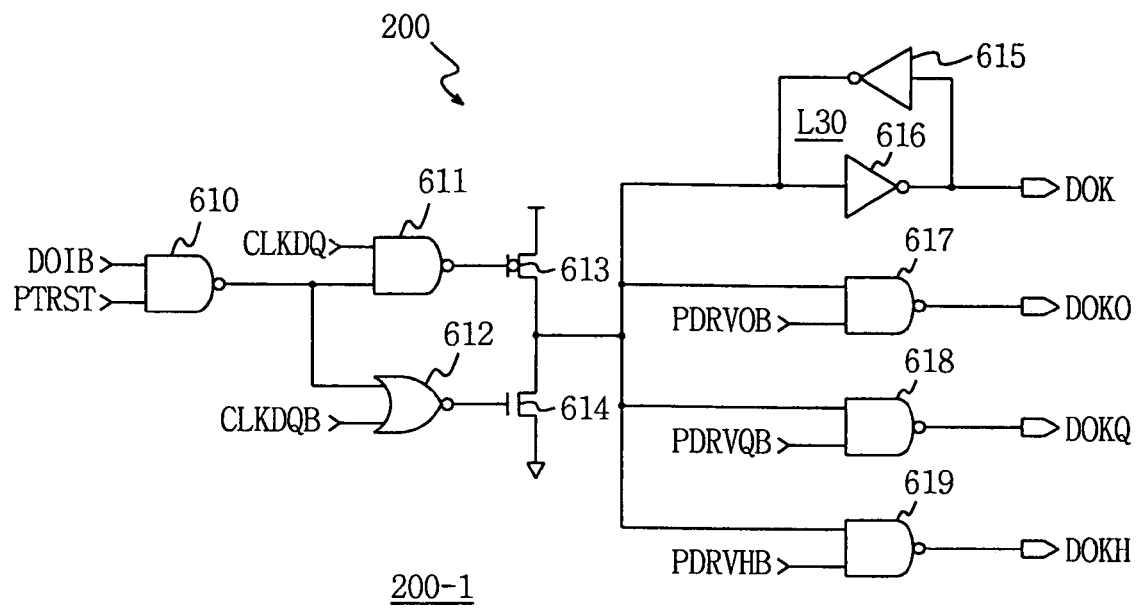
200-1
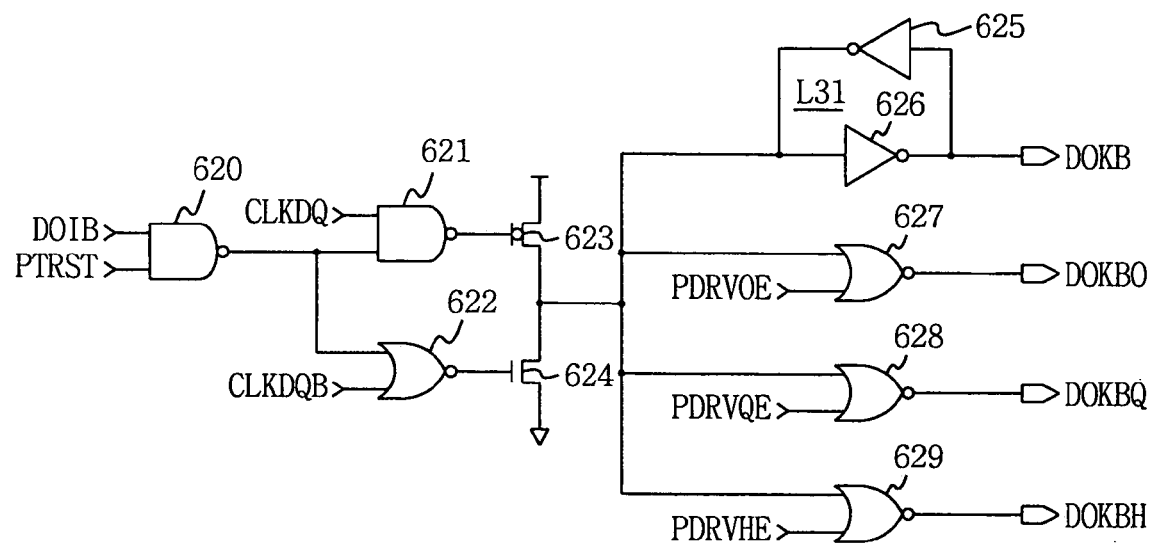
200-2

FIG. 9

| Fuse Cutting | | NO3 | NO2 | NO1 | NO0 | S1 | S0 |
|---|---|---|---|---|---|---|---|
| S1 Driver | S0 Driver | | | | | | |
| 0 | 0 | L | H | L | H | 0 | 0 |
| 0 | 1 | L | H | H | L | 0 | 1 |
| 1 | 0 | H | L | L | H | 1 | 0 |
| 1 | 1 | H | L | H | L | 1 | 1 |

FIG. 10

| CODE | | DS | PDR VOB | PDR VQB | PDR VHB | PDR VOE | PDR VQE | PDR VHE |
|---|---|---|---|---|---|---|---|---|
| S1 | S0 | | | | | | | |
| 0 | 0 | FULL | H | H | H | L | L | L |
| 0 | 1 | 1/2 | H | H | L | L | L | H |
| 1 | 0 | 1/4 | H | L | L | L | H | H |
| 1 | 1 | 1/8 | L | L | L | H | H | H |

DATA OUTPUT CIRCUIT IN A SEMICONDUCTOR MEMORY DEVICE AND CONTROL METHOD OF A DATA OUTPUT CIRCUIT

BACKGROUND AND SUMMARY

1. Field of the Invention

Embodiments of the present invention relate to a semiconductor memory device and a data output circuit. This application claims priority under 35 U.S.C. §119 from Korean Patent Application 2003-64344, filed on Sep. 17, 2003, the contents of which are hereby incorporated by reference in their entirety.

2. Description of the Related Art

A semiconductor memory device (e.g. dynamic random access memory (DRAM)) may employ a data output circuit which outputs data from a selected memory cell. The output circuit may include a data output buffer and a data output driver. The output circuit may have a current drivability that is in conformity with a corresponding output load. The driver strength of the data output driver should be adequate for the output load, in order to substantially reduce skew that limits high frequency performance.

Control of the driver strength, after the completion of production and the shipment of memory products, may be desirable. Thus, semiconductor manufacturers often design chips having controlled driver strength of the data output driver, by using a circuit such as a mode register set (MRS).

FIG. 1 is a circuit diagram of a driver strength code setting circuit. A data output driver includes four output drive units, that are independently controlled and share an output terminal. If the size ratio of the four output drive units is 1:1:2:4, a logic state of control codes S0 and S1 is 00, 01, 10, or 11, by using MRS codes of 2 bits. Accordingly, a driver strength (DS) value of the data output driver can be controlled to four levels (full, ½, ¼, and ⅛). For example, when logic states of a first MRS code MRS CODE 0 and a second MRS code MRS CODE 1 are individually applied as 0,0 and a set control signal PMRS_SET is applied at a high level (e.g. 1), the control codes S0 and S1 are each generated as 0,0 through an operation of the circuit of FIG. 1. As another example, when the logic states of the first MRS code MRS CODE 0 and the second MRS code MRS CODE 1 are individually applied as 0,1 and the set control signal PMRS_SET is applied at a high level (e.g. 1), the control codes S0 and S1 are each generated as 0,1.

In the circuit which generates the control code value S0, an inverter IN1 inverts a logic state of the first MRS code MRS CODE 0 and outputs it as an input of a pass gate PG1. The pass gate PG1 passes the output of the inverter IN1 only when the set control signal PMRS_SET is 1. An output of the pass gate PG1 is inverted by an inverter IN3 of a latch L1 and is provided as an output of the control code S0.

In the circuit of FIG. 1, a power up signal VCCH is applied to a gate of a PMOS transistor PM1. VCCH changes from a low level to a high level by an increase of power source VCC, as shown in FIG. 2. Thus, the control codes S0, S1 are initially set as 0,0. Accordingly, when the power up signal VCCH is at a low level, the PMOS transistor PM1 is turned on and the input terminal of the latch L1 (i.e. the input of the inverter IN3) is at a high level and the output of the inverter IN3 is at a low level. Thus, even though the power up signal VCCH changes to a high level, an initial value of the control codes S0 and S1 are fixed at 0,0, in the circuit of FIG. 1.

The driver strength (DS) value may be controlled to be one of four levels (e.g. full, ½, ¼, and ⅛) by applying MRS codes of 2 bits in the circuit referred to FIG. 1. However, at the time of manufacturing, an initial value of the control codes S0, S1 are fixed to one value set, even without any selection. If the initial values of the control codes S0 and S1 are generated as 01, 10, or 11, the circuit would have to be changed. In other words, a fabrication mask required to fabricate a semiconductor memory device would have to be changed, which would increase manufacturing costs. In other words, since the initial value of the driver strength is fixed at one value at the time of manufacturing, a fabrication mask must be changed if the users require different initial values of the driver strength.

SUMMARY OF THE INVENTION

Embodiments of the present invention relate to a semiconductor memory device having a data output circuit, which has flexibility in setting the initial value of the driver strength. Embodiments relate to a method of diversely setting initial values of a driver strength without changing a fabrication mask in a data output driver of a semiconductor memory device. In embodiments, an initial value of driver strength can be selected by a specific requirement of a user, after the time of manufacturing. The driver strength may be controlled by external control.

Embodiments of the present invention relate to a method of setting an initial value for a driver strength, in which one optional value of determined driver strength values can be changed from the initial value, by fuse programming. Accordingly, the driver strength can be changed without a revision of a mask.

According to embodiments of the invention, a semiconductor memory device includes a data output buffer and a data output driver, a control code setting unit, and a driver strength control signal generator. The control code setting unit sets one of the predetermined driver strength control code values as an initial control code value, by selective internal programming. The control code setting unit outputs the set initial control code value in response to a mode register set code. Alternatively, the control code setting unit outputs another control code setting unit driver strength control code value as the control code value. The driver strength control signal generator may receive the control code value output from the control code setting unit and generate a plurality of driver strength control signals, corresponding to the control code value.

According to embodiments of the invention, a semiconductor memory device includes a control code setting unit, a driver strength control signal generator, a data output buffer, and a data output driver. The control code setting unit sets one of a plurality of predetermined driver strength control code value as an initial control code value by selective internal programming. The control code setting unit selectively updates the set initial control code value in response to an external control. The driver strength control signal generator receives the control code value output from the control code setting unit and generates a plurality of driver strength control signals corresponding to the control code value. The data output buffer individually combines sensing output data with the plurality of driver strength control signals and outputs weighted-data output signals. The data output driver includes a plurality of output drive units that are independently controlled. The plurality of output drive units share an output terminal and output to the output terminal output data that controls driver strength, by each selective operation of the plurality of output drive units responding to the weighted-data output signals.

Embodiments of the invention relate to a method of controlling driver strength in a semiconductor memory device having a data output driver. The data output driver has a plurality of output drive units that output to an output terminal output data that controls driver strength. The plurality of output drive units are independently controlled in response to applied weighted-data output signals and share the output terminal. The method includes setting one of a plurality of predetermined driver strength control code values as an initial control code value by selective internal programming. The method includes outputting the initial control code value as a control code value when a state of a mode register set code coincides with the set initial control code value. The method includes outputting another one of the plurality of driver strength control code values as the control code value, when the state of the mode register set code differs from the set initial control code value. The method includes generating a plurality of driver strength control signals corresponding to the control code value and individually combining sensing output data with the plurality of driver strength control signals to provide weighted-data output signals to the data output driver.

Embodiments enable an initial value required by users to be flexibly determined, without a revision of a semiconductor processing mask. Accordingly, the initial values can be set after production and shipment of memory chips, since a strength control code values can be set as an initial control code value by a selective internal programming.

BRIEF DESCRIPTION OF THE DRAWING

Example FIG. 1 is a circuit diagram of a driver strength code setting circuit.

Example FIG. 2 is a graph of a curved line, illustrating a power up signal.

Example

Example

Example

Example FIG. 7 is a circuit diagram illustrating a data output buffer.

Example

Example FIGS. 9 and 10 are tables illustrating a logic state of driver strength control signals.

DETAILED DESCRIPTION OF THE INVENTION

Hereinafter, example embodiments of the present invention are described with reference to example FIGS. 3 to 10. It will be understood by those skilled in the art that the present invention can be embodied by numerous different types and is not limited to the following described embodiments. The following various embodiments are example in nature.

Figure 3:
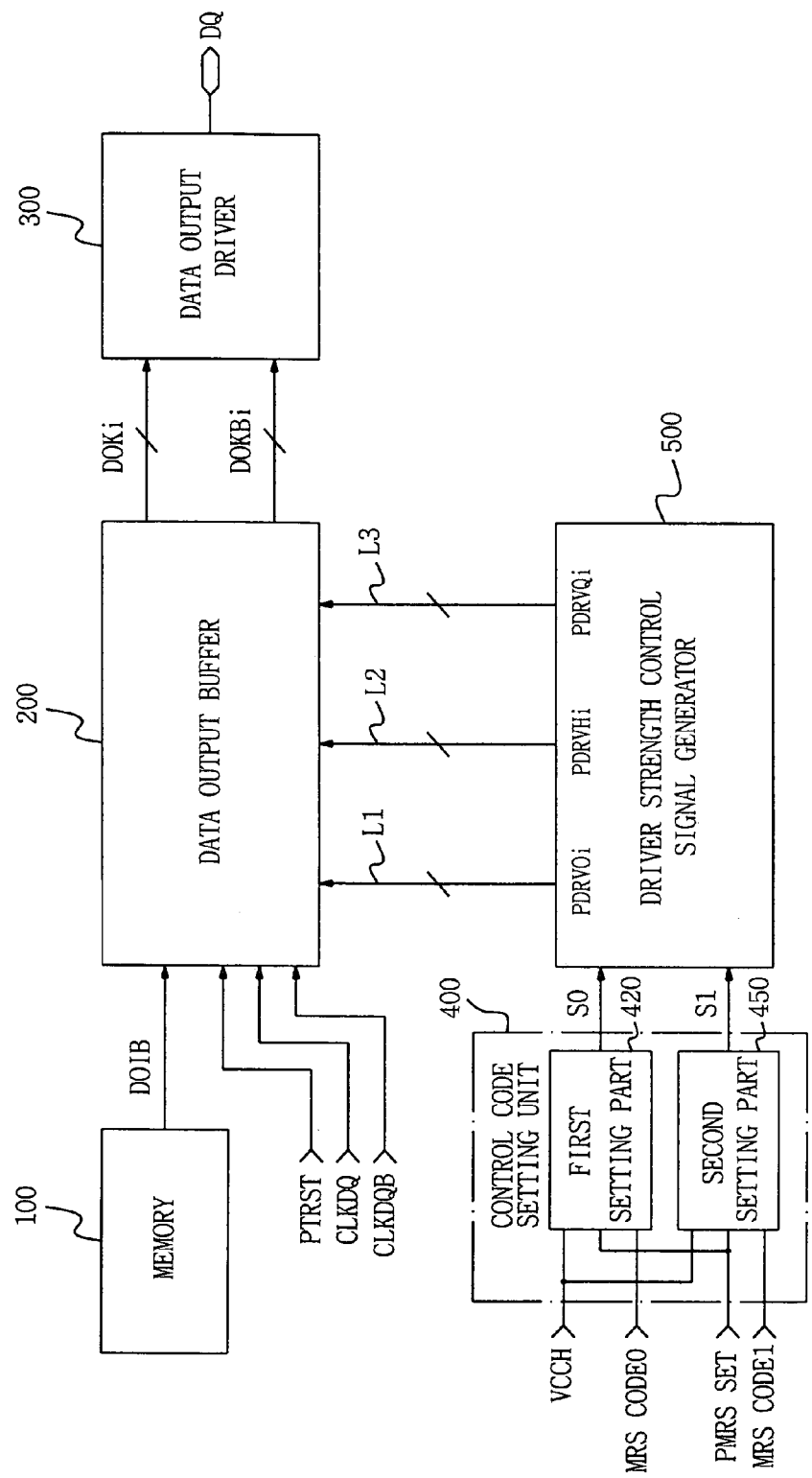
FIG. 3 is a block diagram of a data output circuit of a semiconductor memory device, according to example embodiments of the present invention.

FIG. 3 is a block diagram of a data output circuit for use in a semiconductor memory device, according to example embodiments of the present invention. A semiconductor memory device includes a memory 100 and a data output circuit. The data output circuit includes a data output buffer 200, a data output driver 300, a control code setting unit 400, and a driver strength control signal generator 500.

The control code setting unit 400 sets one of a plurality of predetermined driver strength control code values as an initial control code value by a selective internal programming. The control code setting unit 400 selectively updates the set initial control code value in response to external control. The control code setting unit 400 includes a first setting part 420 and a second setting part 450.

Figure 4:
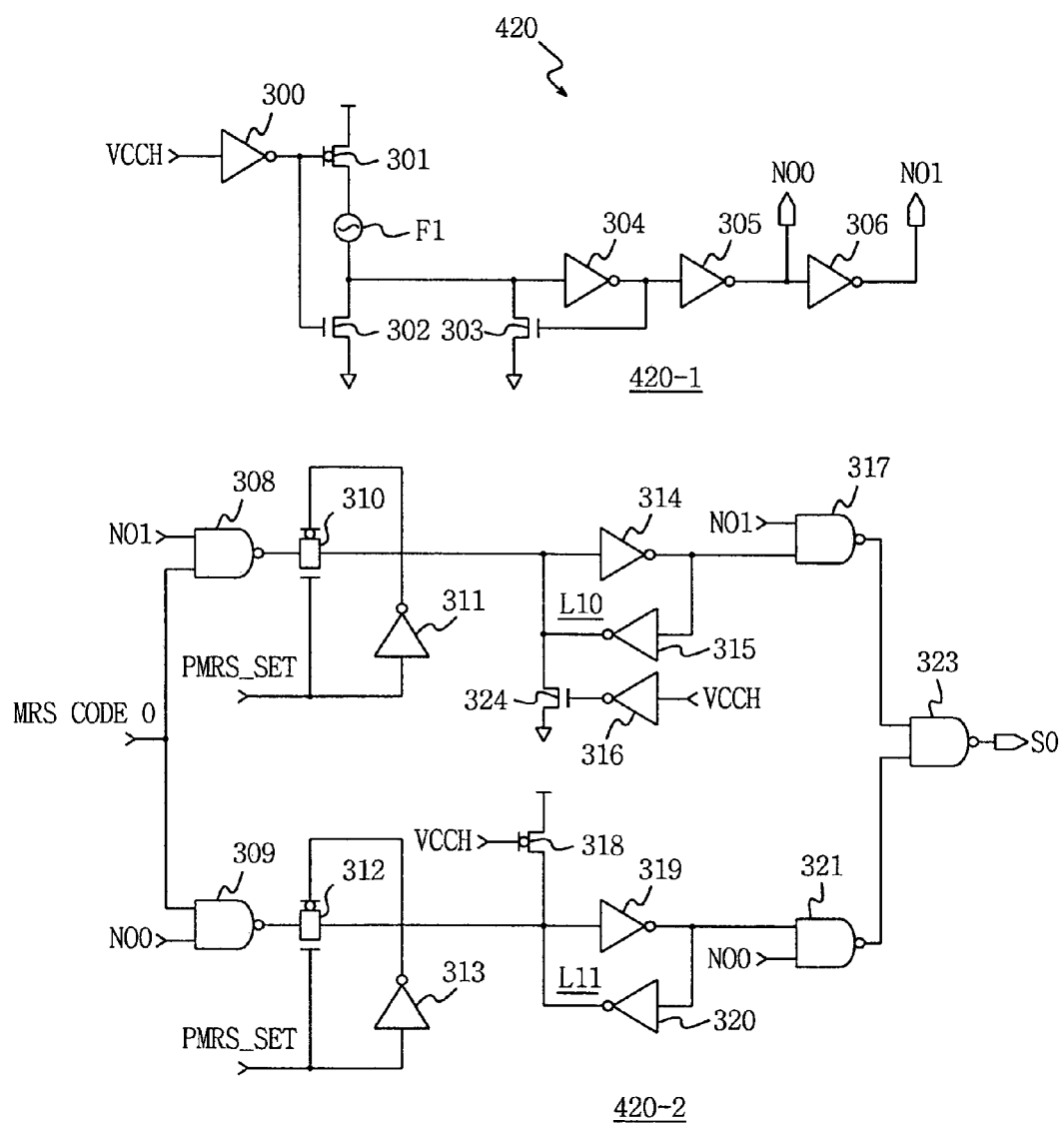
FIG. 4 is a circuit diagram illustrating a first setting part. Page 4 of Example

As shown in FIG. 4, the first setting part 420 includes a first fuse program block 420-1 and a first control code value generating block 420-2. The first fuse program block 420-1 generates a first initial control code signal NO0, NO1. The first initial control code signal NO0, NO1 corresponds to a portion of the initial control code value, in conformity with a program state of a first fuse F1. The first control code value generating block 420-2 combines the first initial control code signal NO0, NO1 with a first mode register code MRS CODE 0 and outputs a first control code value S0.

Figure 5:
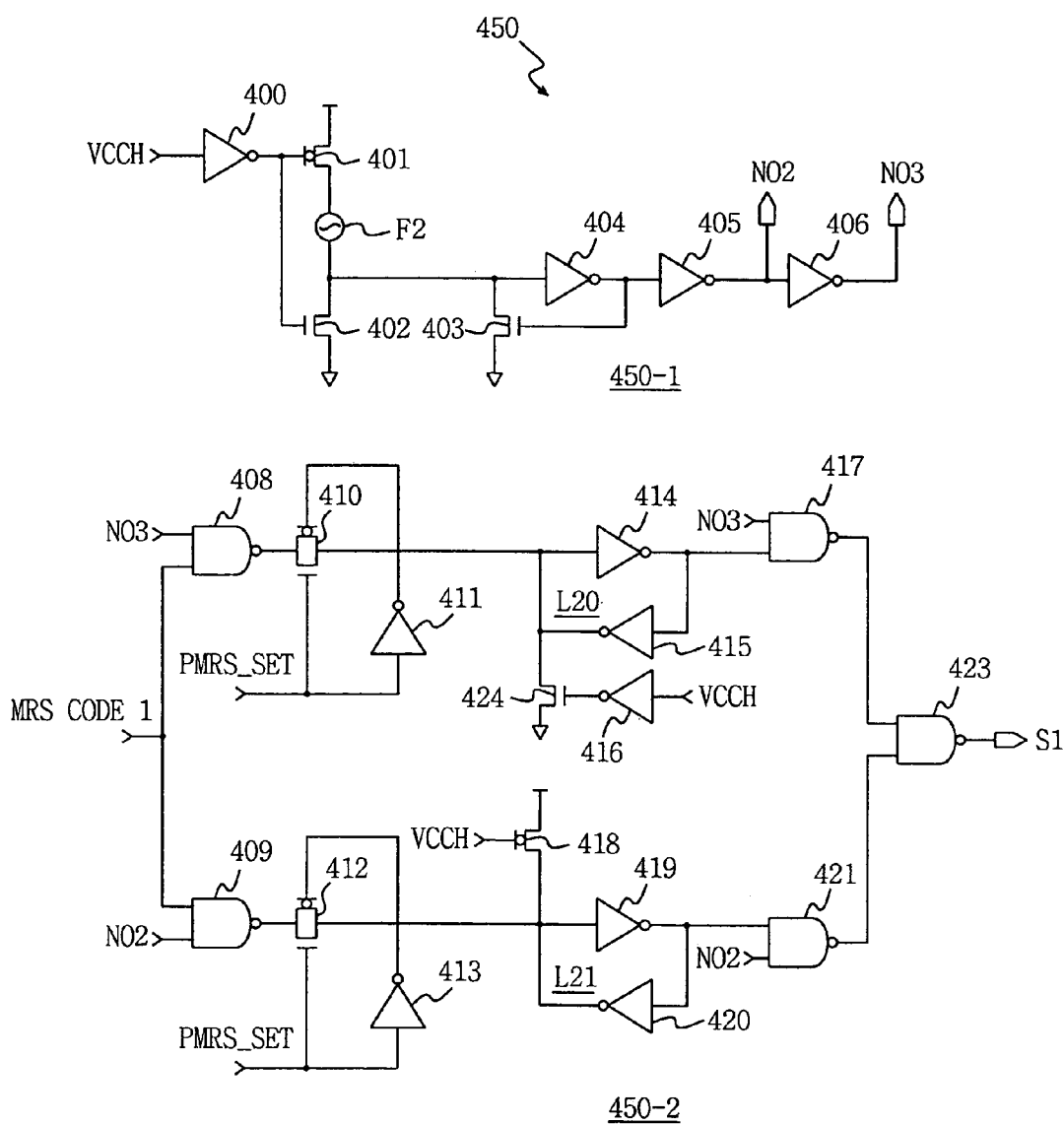
FIG. 5 is a circuit diagram illustrating a second setting part.

As shown in FIG. 5, the second setting part 450 includes a second fuse program block 450-1 and a second control code value generating block 450-2. The second fuse program block 450-1 generates a second initial control code signal NO2, NO3 that corresponds to the rest initial control code value, in conformity with a program state of a second fuse F2. The second control code value generating block 450-2 combines the second initial control code signal NO2, NO3 with a second mode register code MRS CODE 1 and outputs a second control code value S1.

In FIG. 3, the driver strength control signal generator 500 receives the control code value S0, S1 output from the control code setting unit and generates a plurality of driver strength control signals PDRVOi, PDRVHi, PDRVQi corresponding to the control code value. The data output buffer 200 individually combines sensing output data DOIB (output from the memory 100) with the plurality of driver strength control signals PDRVOi, PDRVHi, PDRVQi, to output weighted-data output signals DOKi, DOKBi.

Figure 8:
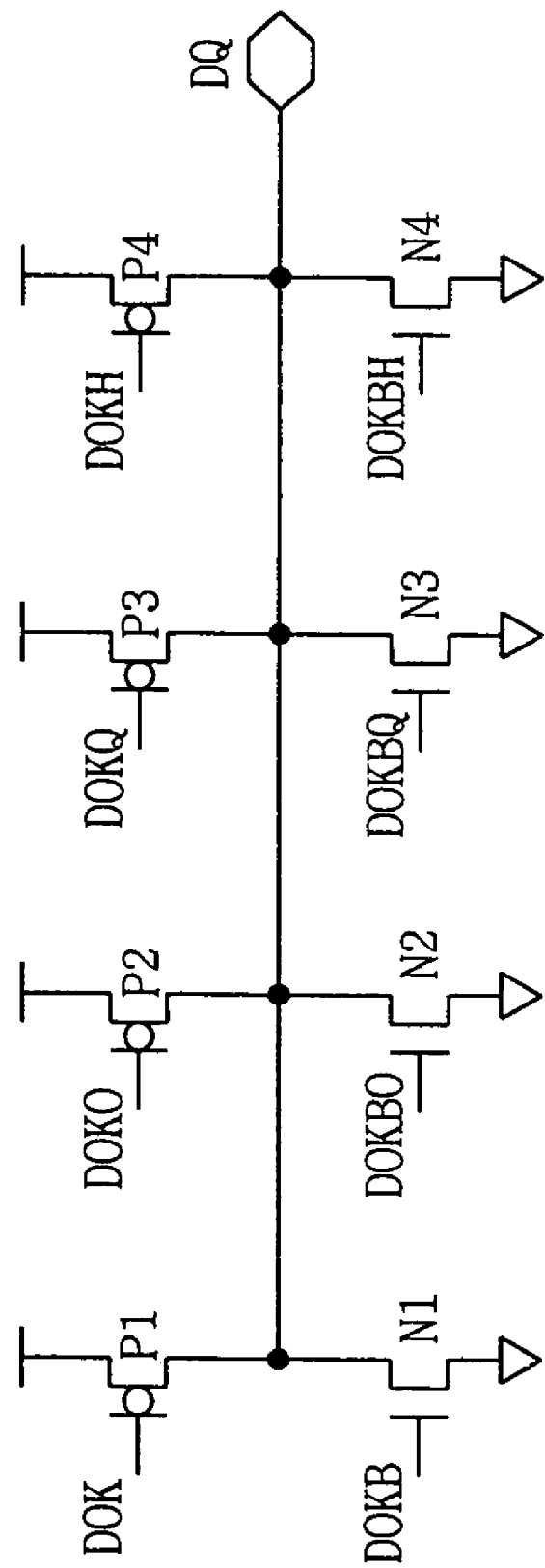
FIG. 8 is a circuit diagram illustrating a data output driver.

As shown in FIG. 8, the data output driver 300 includes a plurality of output drive units that are independently controlled and share a common output terminal DQ. The driver strength at output terminal DQ is controlled by the selective operations of the plurality of output drive units responding to the weighted-data output signals DOKi, DOKBi.

FIG. 4 is a circuit diagram of the first setting part 420. The first setting part 420 includes the first fuse program block 420-1 and the first control code value generating block 420-2. The first fuse program block 420-1 includes an inverter 300, a PMOS transistor 301, a first fuse F1, and an NMOS transistor 302. The inverter 300 inverts the logic of the power up signal VCCH. The PMOS transistor 301 operates in response to the output of the inverter 300. The first fuse F1 is connected to the drain of the PMOS transistor 301. The first fuse F1 may be curable. The NMOS transistor 302 is connected to the first fuse F1. The gate of the NMOS transistor 302 receives an output of the inverter 300.

The first fuse program block 420-1 includes an inverter 304, an NMOS transistor 303, an inverter 305, and an inverter 306. The inverter 304 is connected to the first fuse F1 and inverts the logic according to the cutting/noncutting state of the first fuse F1. The gate of the NMOS transistor 303 is connected to an output of the inverter 304. The drain of the NMOS transistor 303 is connected to the first fuse F1. The inverter 305 inverts the output of the inverter 304 and outputs it as a first initial control code signal NO0. The inverter 306 inverts an output of the inverter 305 and outputs it as a first initial control code signal NO1.

The first control code value generating block 420-2 includes a NAND gate 308, a pass gate 310, an inverter 311, an inverter latch L10, an inverter 316, an NMOS transistor 324, a NAND gate 317, a NAND gate 309, a pass gate 312, an inverter 313, an inverter latch L11, a PMOS transistor 318, a NAND gate 321, and a NAND gate 323. The NAND gate 308 receives the first initial control code signal NO1 and the first mode register code MRS CODE 0 and generates a NAND response. The pass gate 310 transmits the output of the NAND gate 308 in response to a set control signal PMRS_SET. The inverter 311 inverts the logic of the set control signal PMRS_SET. The inverter latch L10 includes inverters 314 and 315 and latches the output of the pass gate 310.

The inverter 316 inverts the logic of the power up signal VCCH. The NMOS transistor 324 operationally connects an output node of the inverter 315 to ground in response to the output of the inverter 316. The NAND gate 317 receives the output of the inverter latch L10 and the first initial control code signal NO1 and generates a NAND response. The NAND gate 309 receives the first initial control code signal NO0 and the first mode register code MRS CODE 0 and generates a NAND response. The pass gate 312 transmits the output of the NAND gate 309 in response to the set control signal PMRS_SET. The inverter 313 inverts the logic of the set control signal PMRS_SET. The inverter latch L11 includes inverters 319 and 320 that latch the output of the pass gate 312. The PMOS transistor 318 holds an input terminal of the inverter latch L11 at a level of the power source, in response to the power up signal VCCH. The NAND gate 321 receives the output of the inverter latch L11 and the first initial control code signal NO0 and generates a NAND response. The NAND gate 323 is for NAND gating an output of the NAND gate 317 and an output of the NAND gate 321 to output a first control code value S0.

FIG. 5 is a circuit diagram of the second setting part 450. The second seting part 450 includes a second fuse program block 450-1 and a second control code value generating block 450-2. The second fuse program block 450-1 includes an inverter 400, a PMOS transistor 401, a second fuse F2, an NMOS transistor 402, an inverter 404, an NMOS transistor 403, an inverter 405, and an inverter 406. The inverter 400 inverts the logic of the power up signal VCCH. The PMOS transistor 401 operates in response to an output of the inverter 400. The second fuse F2 is connected to a drain of the PMOS transistor 401 and is curable. The NMOS transistor 402 is connected to the second fuse F2 and the gate of transistor 402 receives an output of the inverter 400. The inverter 404 is connected to the second fuse F2 and inverts the logic according to the cutting/noncutting state of the second fuse F2. The gate of NMOS transistor 403 is connected to an output of the inverter 404. The drain of NMOS transistor 403 is connected to the second fuse F2. The inverter 405 inverts the output of the inverter 404 as the second initial control code signal NO2. The inverter 406 inverts the output of the inverter 405 and outputs it as a second initial control code signal NO3.

The second control code value generating block 450-2 includes a NAND gate 408, a pass gate 410, an inverter 411, an inverter latch L20, an inverter 416, an NMOS transistor 424, a NAND gate 417, a NAND gate 409, a pass gate 412, an inverter 413, an inverter latch L21, a PMOS transistor 418, a NAND gate 421, and a NAND gate 423. The NAND gate 408 receives the second initial control code signal NO3 and a second mode register code MRS CODE 1 and generates a NAND response. The pass gate 410 transmits the output of the NAND gate 408 in response to the set control signal PMRS_SET. The inverter 411 inverts the logic of the set control signal PMRS_SET. The inverter latch L20 includes inverters 414 and 415. The inverter latch L20 latches the output of the pass gate 410. The inverter 416 inverts the logic of the power up signal VCCH. The NMOS transistor 424 operationally connects the output node of the inverter 415 to ground, in response to the output of the inverter 416. The NAND gate 417 receives the output of the inverter latch L20 and the second initial control code signal NO3 and generates a NAND response. The NAND gate 409 receives the second initial control code signal NO2 and the second mode register code MRS CODE 1 and generates a NAND response. The pass gate 412 transmits the output of the NAND gate 409 in response to the set control signal PMRS_SET. The inverter 413 inverts the logic of the set control signal PMRS_SET. The inverter latch L21 includes inverters 419 and 420 that latch the output of the pass gate 412. The PMOS transistor 418 holds an input terminal of the inverter latch L21 to a level of the power source in response to the power up signal VCCH. The NAND gate 421 receives the output of the inverter latch L21 and the second initial control code signal NO2 and generates a NAND response. The NAND gate 423 is for NAND gating the output of the NAND gate 417 and an output of the NAND gate 421, to output a second control code value S1.

Figure 6:
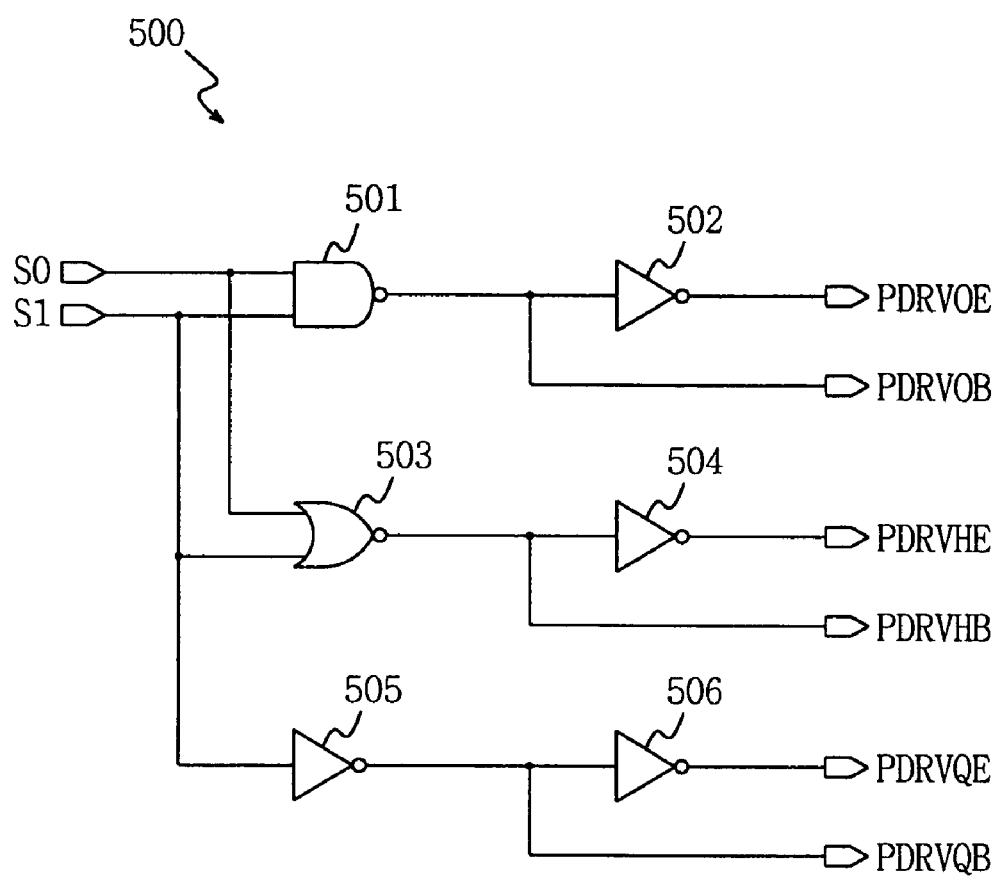
FIG. 6 is a circuit diagram illustrating a driver strength control signal generator.

FIG. 6 is a circuit diagram illustrating the driver strength control signal generator 500. The driver strength control signal generator 500 includes a NAND gate 501, a NOR gate 503, an inverter 505, an inverter 502, an inverter 504, and an inverter 506. The NAND gate 501 is for NAND gating the first and second control code values S0, S1 and generating a driver strength control signal PDRVOB. The NOR gate 503 is for NOR gating the first and second control code values S0, S1 and generating a driver strength control signal PDRVHB. The inverter 505 inverts the logic of the second control code value S1and generates a driver strength control signal PDRVQB. The inverter 502 inverts the output of the NAND gate 501 and generates a driver strength control signal PDRVOE. The inverter 504 inverts an output of the NOR gate 503 and generates a driver strength control signal PDRVHE. The inverter 506 inverts the output of the inverter 505 and generates a driver strength control signal PDRVQE.

FIG. 7 is a circuit diagram of the data output buffer 200. The data output buffer 200 includes a first output buffer part 200-1 and a second output buffer part 200-2. The first output buffer part 200-1 includes a NAND gate 610, a NAND gate 611, a NOR gate 612, a PMOS transistor 613, an NMOS transistor 614, an inverter latch L30, a NAND gate 617, a NAND gate 618, and a NAND gate 619. The NAND gate 610 receives a read command related signal PTRST and the sensing output data DOIB and generates a NAND response. The NAND gate 611 receives the output of the NAND gate 610 and a data output clock CLKDQ and generates a NAND response. The NOR gate 612 receives the output of the NAND gate 610 and a data complementary output clock CLKDQB and generates a NOR response. The PMOS transistor 613 is controlled by the output of the NAND gate 611. The drain of the NMOS transistor 614 is connected to the drain of the PMOS transistor 613 and is controlled by the output of the NOR gate 612. The inverter latch L30 latches the output of the drain of the NMOS transistor 614 and outputs it as a weighted-data output signal DOK. The NAND gate 617 receives the output of the drain of the NMOS transistor 614 and the driver strength control signal PDRVOB and outputs a weighted-data output signal DOKO.

The NAND gate 618 receives the output appearing in the drain of the NMOS transistor 614 and the driver strength control signal PDRVQB and outputs them as the weighted-data output signal DOKQ. The NAND gate 619 receives the output of the drain of the NMOS transistor 614 and the driver strength control signal PDRVHB outputs a weighted-data output signal DOKH.

The second output buffer part 200-2 includes a NAND gate 620, a NAND gate 621, a NOR gate 622, a PMOS transistor 623, an NMOS transistor 624, an inverter latch L31, a NOR gate 627, a NOR gate 628, and a NOR gate 629. The NAND gate 620 receives the read command related signal PTRST and the sensing output data DOIB. The NAND gate 621 receives the output of the NAND gate 620 and the data output clock CLKDQ. The NOR gate 622 receives the output of the NAND gate 620 and the data complementary output clock CLKDQB. The PMOS transistor 623 is controlled by the output of the NAND gate 621. The drain of NMOS transistor 624 is connected to the drain of the PMOS transistor 623 and is controlled by the output of the NOR gate 622. The inverter latch L31 latches the output of the drain of the NMOS transistor 624 and outputs it as a weighted-data output signal DOKB. The NOR gate 627 receives the output appearing at the drain of the NMOS transistor 624 and a driver strength control signal PDRVOE and outputs a weighted-data output signal DOKBO. The NOR gate 628 receives the output of the drain of the NMOS transistor 624 and a driver strength control signal PDRVQE and outputs a weighted-data output signal DOKBQ. The NOR gate 629 receives the output of the drain of the NMOS transistor 624 and a driver strength control signal PDRVHE and outputs a weighted-data output signal DOKBH.

FIG. 8 is a circuit diagram of the data output driver 300. The data output driver 300 includes four output drive units that are controlled independently and share an output terminal DQ. The four output drive units are constructed of a plurality of PMOS and NMOS transistors P1–P4, N1–N4 for pull-up and pull-down operations. Control of the driver strength (e.g. full, ½, ¼ and ⅛) is based on the control codes S0, S1, sizes of PMOS transistors (e.g. P1, P2, P3, and P4, which are P1=wp1, P2=wp1, P3=2wp1, and P4=4wp1), and sizes of NMOS transistors (e.g. N1, N2, N3, and N4, which are N1=wn1, N2=wn1, N3=2wn1, and N4=4wn1).

Referring to FIG. 3, in embodiments, if the driver strength value of the data output driver 300 is classified into four values (e.g. full, ½, ¼ and ⅛), the four output drive units of FIG. 8 each have a drive capacity of ⅛, ⅛, ¼ and ½ based on a size determination rate of the transistor. The output drive unit includes PMOS and NMOS transistors P1 and N1 that have a drive capacity of ⅛. The output drive unit includes PMOS and NMOS transistors P2 and N2 that have a drive capacity of ⅛. The output drive unit includes PMOS and NMOS transistors P3 and N3 that have a drive capacity of ¼. The output drive unit includes PMOS and NMOS transistors P4 and N4 that have a drive capacity of ½.

Accordingly, for example, when all the four output drive units of FIG. 8 operate, the driver strength value becomes '⅛+⅛+¼+½=1(full)'. Also, when only the output drive unit including the PMOS and NMOS transistors P4 and N4 operate, the driver strength value becomes ½.

In order to set an initial determination value of the driver strength to 'full', both the first fuse F1 and the second fuse F2 of FIGS. 4 and 5 are uncut. In order to set the initial determination value of the driver strength to ⅛, both the fuses F1 and F2 are cut by light source (e.g. a laser beam). In order to set the initial determination value of the driver strength to ½, only the first fuse F1 is cut and the second fuse F2 is uncut. In order to set the initial determination value of the driver strength to ¼, only the second fuse F2 is cut and the first fuse F1 is uncut.

FIG. 9 is a logic table illustrating a logic state of the control codes S0, S1 generated by a cutting/non-cutting state of the first and second fuses F1 and F2. With reference to FIGS. 4 and 5, if an output of the latches L10 and L20 becomes high and an output of the latches L11 and L21 becomes low, then the initial state of the power up signal VCCH becomes low.

In case the first fuse F1 of FIG. 4 is uncut, a first initial control code signal NO0 is output as a logic "HIGH"(1) when the power up signal VCCH is at a high state. Accordingly, the power up signal VCCH is changed from low to high, then the PMOS transistor 301 is turned on and an input node of the inverter 304 becomes high through the first fuse F1. Thus, the first initial control code signal NO1 is outputted as a logic "LOW" (0). Likewise, in case the second fuse F2 of FIG. 5 is uncut, the second initial control code signal NO2 becomes a logic H and the second initial control code signal NO3 becomes a logic L, after the power up.

If the first fuse F1 is cut, the first initial control code signal NO0 is output as a logic "LOW" (0) when the power up signal VCCH is in a high state. Accordingly, when the power up signal VCCH changes from low to high, the first fuse F1 is cut, even though the PMOS transistor 301 is turned on (i.e. an input node of the inverter 304 becomes low). Accordingly, the first initial control code signal NO1 is output as a logic "H" (1). Likewise, if the second fuse F2 of FIG. 5 is cut, the second initial control code signal NO2 becomes a logic L and the second initial control code signal NO3 becomes a logic H, after the power up. In the fuse cutting index of FIG. 9, "0" indicates an uncut fuse and "1" indicates a cut fuse.

The logic of the output control codes S0 and S1 shown in FIGS. 4 and 5 is set as one of 00, 01, 10, and 11, as shown in the table of FIG. 9. The setting of control codes S0, S1may be by internal programming by fuse cutting and by logic operations of the first and second control code value generating blocks 420-2 and 450-2. The logic operations of blocks 420-2 and 450-2 may be according to an input MRS code. For example, when the first fuse F1 is uncut, the first initial control code signal NO0 becomes H and the first initial control code signal NO1 becomes L. Thus, all outputs from the NAND gate 317 and the NAND gate 321 provided in the first control code value generating block 420-2 become H, then the code S0 (as an output of the NAND gate 323) becomes low (0). When the first fuse F1 is cut, the first initial control code signal NO0 becomes L and the first initial control code signal NO1 becomes H. Thus, the output of the NAND gate 317 and the NAND gate 321 provided in the first control code value generating block 420-2 individually become L, H, then the code S0 as the output of the NAND gate 323 becomes high (1).

The control codes S0 and S1 generated with the logic states shown in the table of FIG. 9 are applied to the driver strength control signal generator 500. The driver strength control signal generator 500 logically combines the control codes S0 and S1 and generates a plurality of driver strength control signals having logic states shown in the table of FIG. 10. For example, when the fuses are uncut, the control codes S0 and S1 are all applied as 00, all outputs of a NAND gate 501, a NOR gate 503 and an inverter 505 become H, and all outputs of inverters 502, 504, 506 become L. Accordingly, if all the control codes S0 and S1 are 00, the driver strength control signals PDRVOB, PDRVQB, PDRVHB of FIG. 10 are H, and the driver strength control signals PDRVOE, PDRVQE, PDRVHE are L.

If the fuses are cut and the control codes S0, S1 are all applied as 11, all outputs of the NAND gate 501, the NOR gate 503 and the inverter 505 become L, and the outputs of the inverters 502, 504, 506 all become H. If all the control codes S0, S1 are 00, the driver strength control signals PDRVOB, PDRVQB, PDRVHB of FIG. 10 are L and the strength control signals PDRVOE, PDRVQE, PDRVHE are H.

As shown in FIG. 10, the generated plurality of driver strength control signals (PDRVOB, PDRVQB, PDRVHB, PDRVOE, PDRVQE, PDRVHE) are applied to the first output buffer part 200-1 and the second output buffer part 200-2. The data output buffer 200 individually combines the sensing output data DOIB with the plurality of driver strength control signals (PDRVOB, PDRVQB, PDRVHB, PDRVOE, PDRVQE, PDRVHE), and outputs weighted-data output signals (DOK, DOKO, DOKQ, DOKH, DOKB, DOKBO, DOKBQ, DOKBH). For example, if drain nodes of the NMOS transistors 614 and 624 shown in FIG. 7 are provided as a logic H by a logic state of the sensing output data DOIB and all the control codes S0 and S1 are 00, the driver strength control signals PDRVOB, PDRVQB, PDRVHB are applied as H and the driver strength control signals PDRVOE, PDRVQE, PDRVHE are applied as L, thus weighted-data output signals (DOK, DOKO, DOKQ, DOKH, DOKB, DOKBO, DOKBQ, DOKBH) are all output as L. Accordingly, only the PMOS transistors P1–P4 of the transistors including the data output driver 300 of FIG. 8 are driven under a pull-up operation and the driver strength becomes 'full' and the output data DQ becomes 1. Meanwhile, if the drain nodes of the NMOS transistors 614 and 624 shown in FIG. 7 are a logic L by a logic state of the sensing output data DOIB and the control codes S0 and S1 are 00, all the weighted-data output signals (DOK, DOKO, DOKQ, DOKH, DOKB, DOKBO, DOKBQ, DOKBH) are output as H. Thus, only the NMOS transistors N1–N4 of the data output driver 300 are driven under a pull-down operation and the driver strength becomes 'full' and the output data DQ becomes 0.

If the drain nodes of the NMOS transistors 614 and 624 shown in FIG. 7 are a logic H by a logic state of the sensing output data DOIB and all the control codes S0 and S1 are 11, the driver strength control signals PDRVOB, PDRVQB, PDRVHB are applied as L and the driver strength control signal PDRVOE, PDRVQE, PDRVHE are applied as H. Accordingly, the weighted-data output signals (DOK, DOKO, DOKQ, DOKH, DOKB, DOKBO, DOKBQ, DOKBH) are L, H, H, H, L, L, L, L. Hence, only the PMOS transistor P1 of the data output driver 300 is driven under a pull-up operation and the driver strength becomes '⅛' and the output data DQ becomes 1. If the drain nodes of the NMOS transistors 614 and 624 are a logic L by a logic state of the sensing output data DOIB and all the control codes S0 and S1 are 11, the weighted-data output signals (DOK, DOKO, DOKQ, DOKH, DOKB, DOKBO, DOKBQ, DOKBH) are output as H, H, H, H, H, L, L, L. Accordingly, only the NMOS transistor N1 of the data output driver 300 is driven under a pull-down operation and the driver strength becomes '⅛' and the output data DQ becomes 0. The driver strength value determined initially before an applied MRS code is set optionally as one of four possibilities by a cut/uncut combination of the first and second fuses F1 and F2.

When a mode register set command is applied from the outside after setting an optional driver strength value by a selective internal programming, the set initial control code value is selectively updated by operation of embodiments of the present invention. In other words, not only can the driver strength be optionally selected by a fuse option, but also be optionally selected by a mode register set.

A mode register set circuit is often employed in a semiconductor memory device such as DRAM (SDRAM) of a synchronous type. The example of the mode register for generating a burst length signal in response to a mode register set signal is disclosed in U.S. Pat. No. 5,923,595 that has been issued on Jul. 13, 1999. Also, the example of the mode register for setting various operating modes is disclosed in U.S. Pat. No. 5,999,483 that was published on Dec. 7, 1999. In the example embodiments of the present invention, the mode register set codes MRS0, MRS1 may be also generated by using non-used codes instead of the regulated mode register code, such as the burst length signal.

According to example embodiments of the invention, one of a plurality of predetermined driver strength control code values can be set as an initial control code value by a selective internal programming. Accordingly, in embodiments, users can flexibly determine their desired initial values even without a revision of a semiconductor processing mask. As described above, according to example embodiments of the invention, the advantage of flexibly determining an initial value required by users, without a revision of mask, reduces at manufacturing costs.

It will be apparent to those skilled in the art that modifications and variations can be made in the embodiments of the present invention without deviating from the spirit or scope of the invention. Thus, it is intended that the present invention cover any such modifications and variations of this invention provided they come within the scope of the appended claims and their equivalents. For example, the driver strength values, or the number of the output drive units within the data output driver, and a control method of a pull-up and pull-down drive may be changed diversely. Accordingly, these and other changes and modifications are seen to be within the true spirit and scope of embodiments of the invention as defined by the appended claims.

What is claimed is:

1. A semiconductor memory device comprising:
   a control code setting unit, wherein the control code setting unit sets one of a plurality of predetermined driver strength control code values as an initial control code value by selective internal programming, and wherein the control code setting unit selectively updates the set initial control code value in response to external control;
   a driver strength control signal generator, wherein the drive strength control signal generator receives the control code value output from the control code setting unit, and wherein the drive strength control signal generator generates a plurality of driver strength control signals corresponding to the initial control code value;
   a data output buffer, wherein the data output buffer individually combines sensing output data with the plurality of driver strength control signals, and wherein the data output buffer outputs weighted-data output signals; and
   a data output driver, wherein the data output driver includes a plurality of output drive units, wherein the plurality of output drive units are independently controlled and share an output terminal, wherein the data output driver outputs data with a controlled driver strength to the output terminal, and wherein the controller driver strength is according to respective selective operations of the plurality of output drive units corresponding to the weighted-data output signals.

2. The device of claim 1, wherein the selective internal programming of the control code setting unit is setting a state of a fuse.

3. The device of claim 1, wherein the external control of the control code setting unit is according to a mode register set command.

4. The device of claim 1, wherein the control code setting unit comprises:
 a first setting part comprising a first fuse program block and a first control code value generating block, wherein the first fuse program block generates a first initial control code signal according to a program state of a first fuse of the first fuse program block and a power up signal, and wherein the first control code value generating block combines the first initial control code signal with a first mode register code to output a first control code value; and
 a second setting part comprising a second fuse program block and a second control code value generating block, wherein the second fuse program block generates a second initial control code signal according to a program state of a second fuse of the second fuse program block and the power up signal, and wherein the second control code value generating block combines the second initial control code signal with a second mode register code to output a second control code value.

5. The device of claim 1, wherein the driver strength control signal generator generates three pairs of pull-up and pull-down driver strength control signals that have different weighted-values according to a 2 bit control code value output from the control code setting unit.

6. The device of claim 5, wherein the data output buffer comprises:
 a first output buffer part which individually combines the sensing output data with the three pairs of pull-up driver strength control signals to output four pull-up weighted-data output signals; and
 a second output buffer part which individually combines the sensing output data with the three pairs of pull-down driver strength control signals to output four pull-down weighted-data output signals.

7. The device of claim 6, wherein the data output driver comprises four output drive units that are independently controlled and share an output terminal, wherein the four output drive units comprise pull-up transistors which are controlled by the four pull-up weighted-data output signals, and wherein the four output drive units comprise pull-down transistors which are controlled by the four pull-down weighted-data output signals.

8. The device of claim 7, wherein the four output drive units have driver strength states of 1, ½, ¼, and ⅛, respectively.

9. A semiconductor memory device having a data output buffer and a data output driver, comprising:
 a control code setting unit, wherein the control code setting unit sets one of predetermined driver strength control code values as an initial control code value by selective internal programming, and wherein the control code setting unit outputs a control code value according to the set initial control code value and a mode register set code; and
 a driver strength control signal generator which receives the control code value output from the control code setting unit, wherein the driver strength control signal generator generates a plurality of driver strength control signals according to the control code value, wherein the driver strength control signal generator applies the plurality of drive strength control signals to the data output buffer, wherein the data output buffer individually combines sensing output data with the plurality of driver strength control signals, and wherein the data output buffer outputs weighted-data output signals to the data output driver.

10. The device of claim 9, wherein the data output driver comprises a plurality of output drive units, wherein the plurality of output drive units are independently controlled and share an output terminal, and wherein the data output driver outputs output data with a controlled driver strength to the output terminal by selective operations of the plurality of output drive units according to the weighted-data output signals.

11. The device of claim 10, wherein the selective internal programming of the control code setting unit is setting a state of a fuse.

12. The device of claim 11, wherein the control code setting unit comprises:
 a first setting part comprising a first fuse program block and a first control code value generating block, wherein the first fuse program block generates a first initial control code signal according to a program state of a first fuse of the first fuse program block and a power up signal, and wherein the first control code value generating block combines the first initial control code signal with a first mode register code to output a first control code value; and
 a second setting part comprising a second fuse program block and a second control code value generating block, wherein the second fuse program block generates a second initial control code signal a program state of a second fuse of fuse program block and the power up signal, and wherein the second control code value generating block combines the second initial control code signal with a second mode register code to output a second control code value.

13. The device of claim 12, wherein the driver strength control signal generator generates three pairs of pull-up and pull-down driver strength control signals that have different weighted-values according to a 2 bit control code value output from the control code setting unit.

14. The device of claim 13, wherein the data output buffer comprises:
 a first output buffer part which individually combines the sensing output data with the three pairs of pull-up driver strength control signals to output four pull-up weighted-data output signals; and
 a second output buffer part which individually combines the sensing output data with the three pairs of pull-down driver strength control signals to output four pull-down weighted-data output signals.

15. The device of claim 14, wherein the data output driver comprises four output drive units that are independently controlled and share an output terminal, wherein the four output drive units comprise pull-up transistors which are controlled by the four pull-up weighted-data output signals, and wherein the four output drive units comprise pull-down transistors which are controlled by the four pull-down weighted-data output signals.

16. The device of claim 15, wherein the four output drive units have driver strength states of 1, ½, ¼, and ⅛, respectively.

17. A semiconductor memory device comprising:
- a control code setting unit which sets one of a plurality of predetermined driver strength control code values as an initial control code value by a selective internal programming or updating the set initial control code value according to an external control;
- a driver strength control signal generator, wherein the driver strength control signal generator receives the control code value output from the control code setting unit, and wherein the drive strength control signal generator generates a plurality of driver strength control signals corresponding to the initial control code value;
- a data output buffer, wherein the data output buffer individually combines sensing output data with the plurality of driver strength control signals, and wherein the data output buffer outputs weighted-data output signals; and
- a data output driver, wherein the data output driver includes a plurality of output drive units, wherein the plurality of output drive units are independently controlled and share an output terminal, wherein the data output driver outputs data with a controlled driver strength to the output terminal, and wherein the controller driver strength is according to respective selective operations of the plurality of output drive units corresponding to the weighted-data output signals.

18. A semiconductor memory device having a data output buffer and a data output driver, comprising:
- a control code setting unit which sets one of a plurality of predetermined driver strength control code values by a selective internal programming and outputs the value as an initial control code value or which outputs a control code value according to the set initial control code value, a mode register set code, and the plurality of driver strength control code values; and
- a driver strength control signal generator which receives the control code value output from the control code setting unit, wherein the driver strength control signal generator generates a plurality of driver strength control signals according to the control code value, wherein the driver strength control signal generator applies the plurality of drive strength control signals to the data output buffer, wherein the data output buffer individually combines sensing output data with the plurality of driver strength control signals, and wherein the data output buffer outputs weighted-data output signals to the data output driver.

19. A method of controlling driver strength in a semiconductor memory device that comprises a data output driver, wherein the data output driver comprises a plurality of output drive units, wherein the data output driver outputs output data with a controlled driver strength to an output terminal, wherein the plurality of output drive units are independently controlled according to applied weighted-data output signals, and wherein the plurality of output drive units share the output terminal, the method comprising:
- setting one of the plurality of predetermined driver strength control code values as an initial control code value by selective internal programming;
- outputting the initial control code value as a control code value when a state of a mode register set code coincides with the set initial control code value;
- outputting one of the plurality of predetermined driver strength control code values that is different from the initial control code value as the control code value if the state of the mode register set code is different from the set initial control code value;
- generating a plurality of driver strength control signals according to the control code value; and
- individually combining sensing output data with the plurality of driver strength control signals, and outputting weighted-data output signals to the data output driver.

20. The device of claim 19, wherein the selective internal programming is setting a state of a fuse.

21. A method of controlling a driver strength in a semiconductor memory device comprising a data output driver, wherein a driver strength value is controlled to be either full, ½, ¼, or $½^n$, wherein n being a natural number more than 2, the method comprising:
- setting a first driver strength value according to fuse programming after a power-up state;
- setting a second driver strength value according to a mode register set code; and
- enabling an initial value of driver strength before the receipt of the mode register set code as the first drive strength value.

* * * * *